(12) United States Patent
Lindemann et al.

(10) Patent No.: US 9,191,024 B2
(45) Date of Patent: Nov. 17, 2015

(54) SYSTEM FOR LINEAR INTERPOLATION IN MULTIPLE DIMENSIONS

(71) Applicant: PR Electronics A/S, Rønde (DK)

(72) Inventors: Stig Alnøe Lindemann, Højbjerg (DK); Mads Kolding Nielsen, Hovedgård (DK)

(73) Assignee: PR Electronics A/S, Rønde (DK)

( * ) Notice: Subject to any disclaimer, the term of this patent is extended or adjusted under 35 U.S.C. 154(b) by 0 days.

(21) Appl. No.: 14/394,297

(22) PCT Filed: Apr. 11, 2013

(86) PCT No.: PCT/DK2013/050099
§ 371 (c)(1),
(2) Date: Oct. 14, 2014

(87) PCT Pub. No.: WO2013/152773
PCT Pub. Date: Oct. 17, 2013

(65) Prior Publication Data
US 2015/0116137 A1    Apr. 30, 2015

(30) Foreign Application Priority Data
Apr. 13, 2012   (DK) .................................. 2012 70185

(51) Int. Cl.
| H03M 1/06 | (2006.01) |
|---|---|
| H03M 1/46 | (2006.01) |
| G01D 3/02 | (2006.01) |
| H03M 1/10 | (2006.01) |
| H03M 3/00 | (2006.01) |
| H03M 1/08 | (2006.01) |
| H03M 7/30 | (2006.01) |

(52) U.S. Cl.
CPC .................. *H03M 1/46* (2013.01); *G01D 3/022* (2013.01); *H03M 1/1042* (2013.01); *H03M 3/388* (2013.01); *H03M 1/0827* (2013.01); *H03M 3/46* (2013.01); *H03M 7/302* (2013.01)

(58) Field of Classification Search
CPC ....... H01M 1/12; H01M 1/1038; H01M 1/00; H01M 1/66; H01M 1/1019; H01M 3/388; H01M 3/458; H01M 2201/834; H01M 2201/2291; H01M 2201/11; H01M 2201/12; H01M 1/46; H01M 2201/20; H01M 1/001; H01M 3/50
USPC .................................................. 341/117–120
See application file for complete search history.

(56) References Cited

U.S. PATENT DOCUMENTS

| 6,329,817 | B1 | 12/2001 | Moginine Gummer et al. |
|---|---|---|---|
| 6,900,749 | B2* | 5/2005 | Tani et al. ...................... 341/118 |
| 7,031,395 | B2 | 4/2006 | Hinrichs et al. |
| 7,075,463 | B2* | 7/2006 | Arimura et al. ................ 341/118 |
| 7,116,258 | B2* | 10/2006 | Arimura et al. ................ 341/144 |
| 7,928,886 | B2 | 4/2011 | Koch |
| 2010/0207790 | A1* | 8/2010 | Toyota et al. .................. 341/118 |
| 2011/0037628 | A1* | 2/2011 | Petrovic ........................ 341/118 |
| 2011/0215956 | A1* | 9/2011 | Ishikawa ....................... 341/110 |

FOREIGN PATENT DOCUMENTS

DE    44 34 553  A1    4/1996

* cited by examiner

*Primary Examiner* — Jean B Jeanglaude
(74) *Attorney, Agent, or Firm* — Roberts Mlotkowski Safran & Cole, PC

(57) ABSTRACT

A system for galvanic isolation between an analog input signal and an analog output signal, which system performs an analog to digital conversion of the input signals into input digital data. As a result, input parameters can be corrected in a nearly perfect way.

10 Claims, 2 Drawing Sheets

_US 9,191,024 B2_

SYSTEM FOR LINEAR INTERPOLATION IN MULTIPLE DIMENSIONS

BACKGROUND OF THE INVENTION

1. Field of the Invention

The present invention relates to a system and a method for converting an input signal to an output signal, which system performs an digital conversion of the input signals into input digital data, which system performs digital conversion into the output signal, which system performs separate digital conversion of a plurality input signals.

2. Description of Related Art

German Patent Application DE 44 34 553 A1 concerns a field digital converter. The analog signal is separately converted so that at first digitalization of the current is performed, and parallel to this process, digitalization of the voltage is performed. These two digital signals are then combined in an arithmetic logic circuit where a common signal is achieved which signal is then sent through a galvanic insulator before the signal is sent to a data communication system.

U.S. Pat. No. 6,329,817 discloses a sensor for measuring a parameter including at least one transducer adapted to provide an analog transducer signal, and at least one converter adapted to convert the analog transducer signal into a digitized transducer signal, and a memory device associated with the converter capable of receiving the digitized transducer signal directly from the converter. The memory device is configured to provide a digitized output value from a memory location, the memory location being associated with or corresponding to the digitized transducer signal received by the memory device.

In U.S. Pat. No. 6,329,817, there is no disclosure any galvanic isolation of the signals in that an analog signal is transmitted in parallel to the digital signal for subsequent combination in an analog adder circuit. No galvanic isolation is performed suggested for the analog or digital communication line.

SUMMARY OF THE INVENTION

It is an object of the present invention is to achieve a very precise transmission of analog signals by performing a transformation in the digital domain by using linear interpolation to compensate for any linear and/or non linear effects on the analog signal. It is further the object of the invention to achieve linear interpolation in multiple dimensions in the digital domain This can be achieved if the digital data sets representing the actual measured input signals are corrected in accordance with actual calculated correction values that depend on the transfer function for the given input variables effect on the system. The digital data sets representing input signals are used to address stored correcting data sets, which correcting data sets are stored in at least one matrix of at least two dimensions and are continuously converted to an output signal.

Any electronic data set representing a plurality of parameters can be corrected by using each parameter as pointers in a multidimensional space that comprises correction values stored in a multidimensional matrix. Data from this matrix can form a corrected output signal.

In a possible embodiment of the invention, the input is an analog input signal and the output is an analog output signal. The system performs an analog to digital conversion of the input signals into input digital data and performs digital to analog conversion into the analog output signal. The system performs separate digital conversion of input current and input voltage, and digital data sets representing the actual measured input current are corrected in accordance with an actual calculated correction value, which correction value depends of a nonlinear load for the input current. The digital data sets representing input current and input voltage are used to address a correcting data set which is stored in a matrix of at least two dimensions, the addressed correcting data set being continuously converted to an analog output signal.

Any lack of linearity between the voltage and current can be corrected in a nearly perfect way. This is very important if the metering signal is in fact a current signal and the voltage that is received has a value between wide voltage ranges, i.e., 6-35 volts. By such a high range of voltage that has to be accepted, there will always be some nonlinearity in every system that is receiving this voltage. In many situations the signals are sent through a transformer for galvanic isolation. Therefore, it is crucial to use a system that can correct the nonlinearity so that a received current can be established at the output of the system.

By using the correction a data set, it is possible to perform a correction of all known parameters that influence the measuring signal. Typically, differences in electronic components could have different influenced on different circuits. In a system of the type described here, where correction data sets are placed in a matrix, the contents of this matrix could, in some situations, be independent from unit to unit that is using the same components. In this way, all tolerances of components could be corrected. A coding could be performed during a traditional test where, more or less automatically, the correcting data set is programmed into the matrix as a standard procedure in testing a unit.

The digital data sets representing input current and input voltage are used as pointers into the matrix. By using the data set from the two input channels as pointers for the matrix, a very fast operating system can be achieved which can operate at an extremely fast clock frequency. Therefore it should be possible to work with a rather high upper frequency for the received analog signals that are being converted.

The analog input signal for current and voltage are converted independently of each other to digital data sets by an analog to digital converter. In this way, digitalization can be performed in a way that corresponds to the speeds of the pointers that are used in the system.

The digital data sets generated by the analog to digital converter are N-th Order modulated in a digital filter before the data is used for the pointers. Because of the number of bits that are generated by the analog to digital conversion, it is highly efficient that a digital filtration is performed which filtration can combine the digital values in a way by which the data contents are still mostly the same, but the number of bits are reduced.

The correcting data set is converted in a first K-th order modulator. The data that has been picked up in the matrix is also filtered in the K-th order modulator in a way where the numbers of bits are reduced without any reduction of the data contents.

The digital signal generated in the first K-th order modulator is further modulated in a second L-th order modulator. By performing a further filtration in the L-th order modulator a further reduction in the bit stream can be achieved and in a way by which the data leaving the L-th order modulator is in a form that can be used for a digital-analog converter.

The digital signal generated in the second L-th order modulator is converted in a digital to analog converter into the analog output signal. Thereby, an analog current value is generated which is connected in a way by which the output current is mostly identical with the input current.

The present invention further concerns a method for signal correction between an input signal and an output signal using the following sequence of steps:
a: perform digital conversion of the input signal into a number of digital data sets (x-bit) representing the parameters of the input signal,
b: perform a high order modulation of the datasets representing parameters of the input signal into a reduced data set for pointers,
c: Use the pointers for selecting data field of a matrix of correction data sets,
d: use the further pointers for selecting datasets,
e: transmit the data set selected by the pointers (a bit) into a further high order modulator and perform the high order modulation into a second data sets (c bit),
f: further perform a low order modulation of the data sets (c bit) into third data sets (d bit),
g: perform a digital to conversion of the third data sets for generating the output.

In a preferred method, the following sequence of steps are taken:
a: perform analog to digital conversion of the input current signal into a first digital data set (x-bit) representing the input current,
b: perform analog to digital conversion of the input voltage signal into a second digital data set (z-bit) representing the input voltage,
d: perform a N-th order modulation of the first data set representing the input current into (v-bit) to a first pointer,
e: perform M-th order modulation of the second data set representing the input voltage into (y-bit) a second pointer,
f: Use the first pointer for selecting a row in a matrix of a correction data sets,
g: use the second pointer for selecting a column in the matrix of the correction data set,
h: transmit the data set selected by the first and second pointer (a bit) into a K-th order modulator and perform the K-th order modulation into a second data set (c bit),
i: further perform an L-th order modulation of the second data set (c bit) into a third data set (d bit),
j: perform a digital to analog conversion for generating the analog output.

By the method, it can be achieved that analog signals received, which comprise a measuring current as that of the actual data set but with different voltages, and that the current signal is corrected so any nonlinearity of the input side of a system is corrected by correcting the data sets in accordance with both current and voltage with correction values, which correction values are sent through different types of digital filtration before they are converted into an analog value. Hereby it is achieved that an analog current value can be transmitted through this system in a very precise manner, without any information being changed.

DETAILED DESCRIPTION OF THE INVENTION

Figure 1:
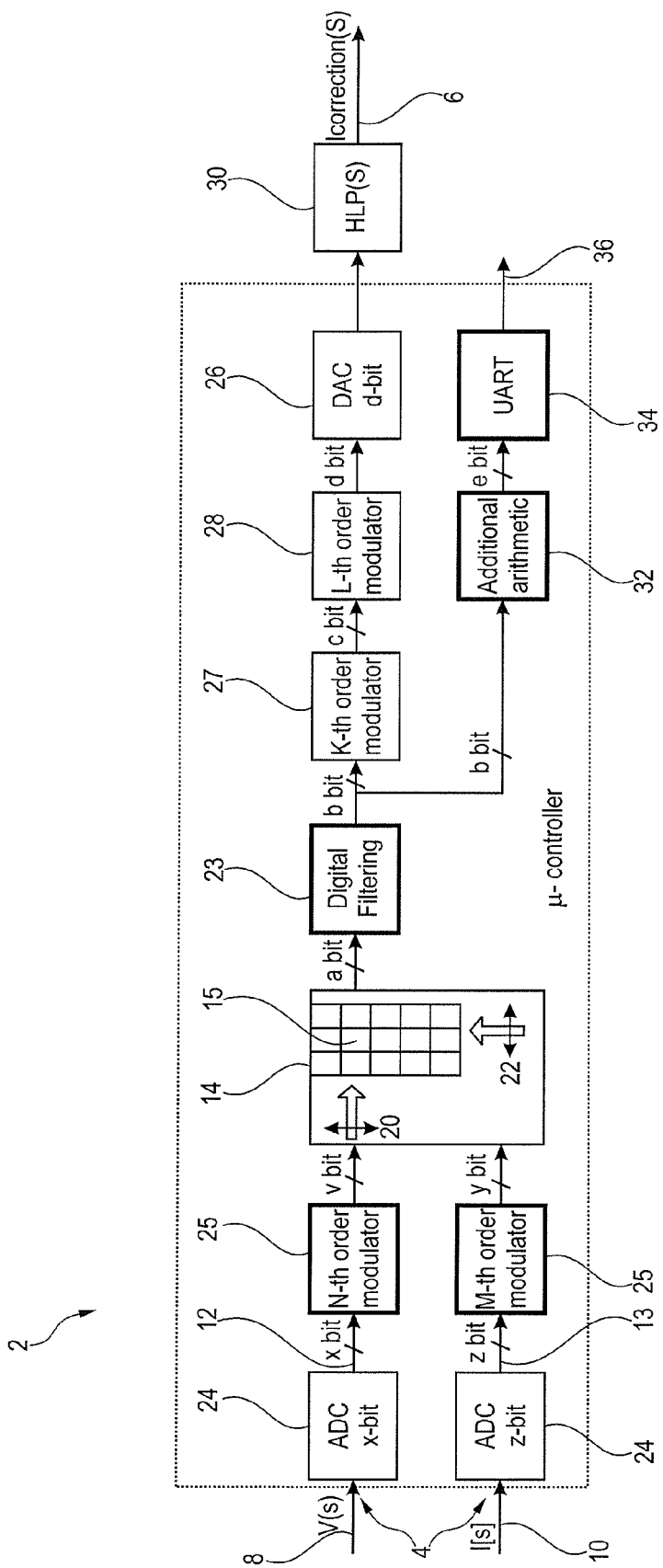
FIG. 1 shows a possible embodiment for a system for analog to digital conversion and back to an analog signal.

FIG. 1 shows a system 2 which system with an analog input 4 and an analog output. The system comprises a voltage input 8 and a current input 10. Both of these input signals are sent through analog to digital converters 24. These analog digital converters are, in a preferred embodiment, but not limited hereto, SAR converters. The each of the analog digital converters delivers a digital data set 12, 13. The data sets 12, 13 are independent of each other and are sent through digital filters 25, which digital filters perform an N-th order modulation of the voltage signals and an M-th order modulation of the data set representing the current. An output is performed as V-bit and Y-bit. The V-bit output from the N-th order modulator 25 is used for controlling a pointer 20 and the Y-bit generated by the M-th order modulator 25 is used for controlling a pointer 22. These pointers 20, 22 are continuously moved dependent on the actual voltage and the actual current.

A matrix 14 comprises correction values for the current. The pointers 20, 22 point one of the data sets in the matrix, for example, the data set 15. This data set is then transmitted as an A-bit into a first digital filter 23. Here, a data stream defined as B-bit is sent into a K-th order modulator 27. A C-bit is afterwards transmitted to an L-th order modulator 28. Further, a D-bit data stream is sent to a digital analog converter 26. This analog signal is then sent to an analog filter 30, before the current signal 6 leaves the system. The B-bit signal is further sent through an additional arithmetic unit 32, and an E-bit signal is sent through a universal asynchronous receiver/transmitter (UART) 34 thereby producing a data signal 36 that represents the current. This data stream can be used for transmitting the measured date segments representing the current further in a system.

In operation, a current input 10 can represent a measured value. In many situations, a signal has to pass through a galvanic isolation, such as a transformer. Transformers are nonlinear so that frequency or voltage influences the impedance, and as such, the relation between input and output current. Therefore, the current representing a measured value has to be corrected after passing a transformer. This can be achieved if the voltage, frequency or current signal is independently converted into a digital data stream in the analog digital converters. These bit streams can be sent through a digital filter of a high order in order to reduce the number of bits, but without reducing the actual data content in the data stream. These two separate data streams are then used for input through pointers in a matrix where the pointers are select a correction value 15 placed somewhere in the matrix. This value is then immediately sent through the output to the digital filter, and further, in reduction of the bits into a data stream of further bits, before the signal is sent through the digital analog converter. Afterward, the signals are again filtered, but this time in an analog filter of a second order. Parallel to that analog signal, a digital output value is generated that is represents the corrected current value used for the input. This digital output can then be used for further data processing.

Figure 2:
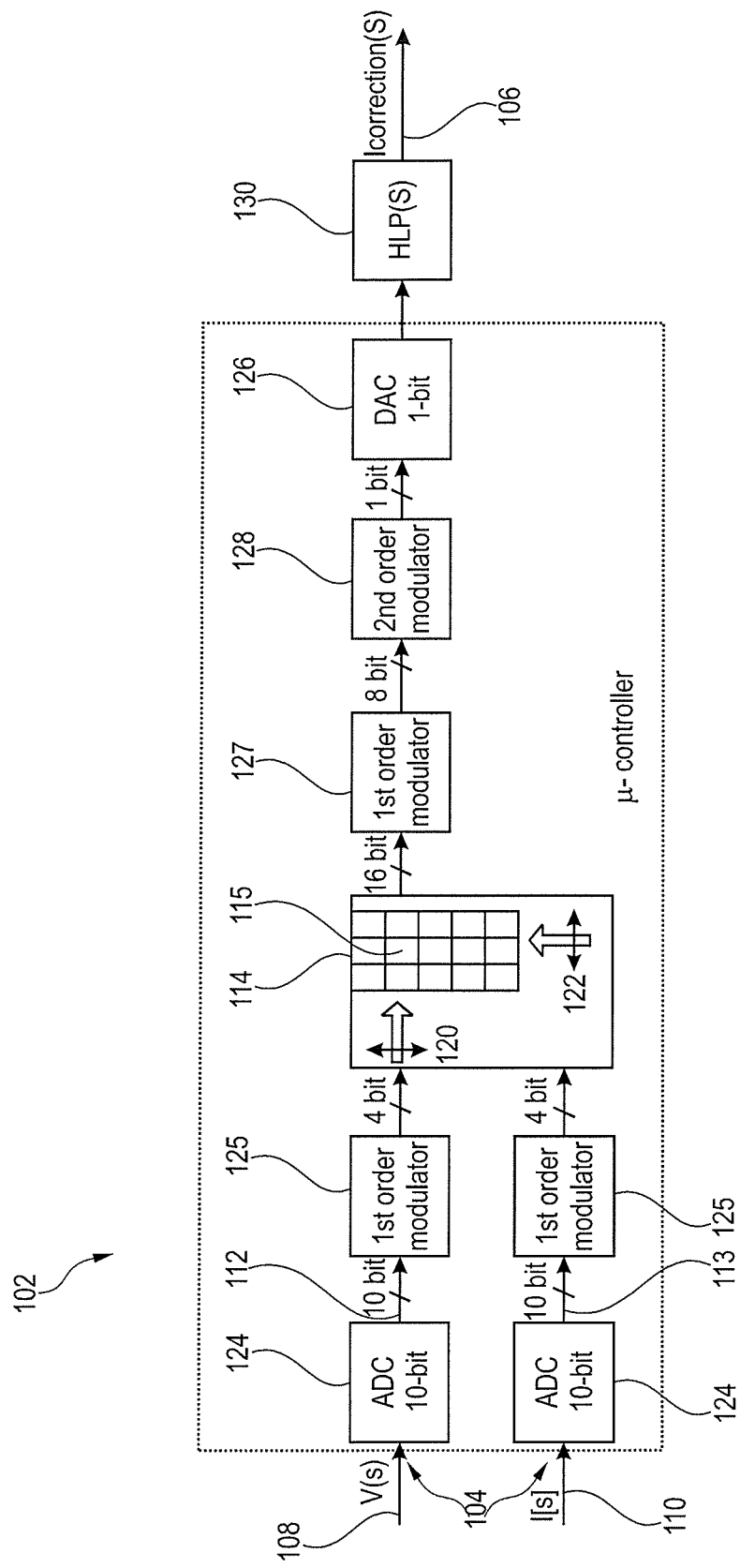
FIG. 2 shows a preferred embodiment for the same system as in FIG. 1.

FIG. 2 shows a system mostly equal to the system shown in FIG. 1, but the system 102 has a double input 104 for a voltage and a current and an output 106. The input terminal for the voltage 108 and the input terminal 110 for the current are sent into two analog digital converters 124 which are 10 bit converters. These two analog digital converters produce 10 bit digital segments 112, 113 which data is sent through a first order modulator 125. Here, the 10 bits are reduced into 4 bits. These 4 bits are then used for the matrix 114 where pointers 120, 122 select a data set 115 which can be a 16 bit data set that is transmitted through the first order modulator 127. Here, the 16 bit data set is changed into a 8 bit data set which is transmitted to a second order modulator 128. The 128 second order modulator converts the 8 bit data set into a 1 bit data stream which is sent to a digital analog converter 126. Afterward, the signals are sent through an analog filter of second order 130 to filter out all higher frequencies which end up in an output current 106.

The invention claimed is:

1. A system for converting input signals to an output signal, comprising:
   a separate convertor for analog to digital conversion of each input signal into input digital data representing at least an actual measured input voltage and input current,
   a data storage with correcting data sets stored in at least one matrix of at least two dimensions,
   means for performing at least a first digital filtration of digital data segments,
   means for using filtrated digital data sets representing input current and input voltage to address the corrected data sets stored in said matrix,
   means for performing at least a second filtration of an addressed correcting data set,
   means for producing a corrected digital signal from the filtered correcting data set, and
   means for converting the corrected digital signal to a combined analog signal.

2. The system according to claim 1, wherein the system further comprises pointers for selecting the correcting digital data sets to be addressed and wherein the digital data sets representing input signals are adapted for controlling the pointers.

3. The system according to claim 2, wherein the system further comprises pointers for selecting the correcting digital data sets to be addressed and wherein the digital data sets representing input signals are adapted for controlling the pointers.

4. The system according to claim 3, wherein the system is further adapted for digitally filtering the digital data sets, generated by the analog to digital converter, of N-th and M-th Order modulated in a digital filter before the data is used for the pointers.

5. A system for converting input signals to an output signal comprising:
   means for receiving analog input signals,
   means for generating an analog output signal,
   means for performing an analog to digital conversion of the analog input signals into input digital data,
   means for performing digital to analog conversion into the analog output signal,
   means for performing separate digital conversion of input current and input voltage,
   means for correction of digital data sets representing the actual measured input current in accordance with an actual calculated correction value,
   means for performing digital filtration by Nth order modulated in a digital filter,
   means for correcting the actual calculated correction value depending of a nonlinear load for the input current,
   means for correcting digital data sets stored in a matrix of at least two dimensions,
   means for addressing one of the stored correction data sets based on digital data sets representing input current and input voltage and continuously converting the addressed data set to an analog output signal.

6. The system according to claim 5, wherein the system is adapted for converting the analog input signals for current and voltage to digital data sets independently of each other.

7. The system according to claim 5, wherein the system further comprises means for converting the correcting data set in a first K-th order modulator so as to increase the sampling frequency and lower the resolution.

8. The system according the claim 7, wherein the system further comprises means for modulation of the digital signal generated in the first K-th order modulator and further for modulation in a second L-th order modulator.

9. The system according the claim 8, wherein the digital to analog converter is adapted for converting the digital signal generated in the second L-th order modulator into the analog output signal.

10. A method for correcting an input signal and into an output signal, comprising the following steps:
   a: performing analog to digital conversion of the input current signal into a first digital data set representing input voltage,
   b: performing analog to digital conversion of the input current signal into a second digital data set representing the input current,
   c: performing an N-th order modulation of the first data set representing the input voltage into a first reduced data set,
   d: performing M-th order modulation of the second dataset representing the input current into a second reduced data set,
   e: using a first pointer for selecting a row in a matrix of correction data sets,
   f: using a second pointer for selecting a column in the matrix of the correction data sets,
   g: transmitting the correction data set selected by the first and second pointers into a K-th order modulator and performing K-th order modulation thereof into a second data set,
   h: performing a L-th order modulation of the second data set into a third data set, and
   i: performing digital to analog conversion for generating the analog output.

* * * * *